United States Patent
Gruendler et al.

(10) Patent No.: US 7,355,858 B2
(45) Date of Patent: Apr. 8, 2008

(54) HEAT SINK FOR SURFACE-MOUNTED SEMICONDUCTOR DEVICES AND MOUNTING METHOD

(75) Inventors: Gerold Gruendler, Regensburg (DE); Juergen Hoegerl, Regensburg (DE); Thomas Killer, Hohenschambach (DE); Volker Strutz, Tegernheim (DE); Erich Syri, München (DE)

(73) Assignee: Infineon Technologies, AG, Neubiberg (DE)

( * ) Notice: Subject to any disclaimer, the term of this patent is extended or adjusted under 35 U.S.C. 154(b) by 64 days.

(21) Appl. No.: 11/375,565

(22) Filed: Mar. 15, 2006

(65) Prior Publication Data

US 2006/0209513 A1  Sep. 21, 2006

(30) Foreign Application Priority Data

Mar. 15, 2005  (DE) ...................... 10 2005 012 216

(51) Int. Cl.
*H05K 7/20* (2006.01)
(52) U.S. Cl. ...................... 361/715; 361/704; 361/717; 361/719; 165/80.2; 165/80.3; 165/104.33; 174/16.3; 174/252
(58) Field of Classification Search ................ 361/690, 361/697, 704–712, 714, 719, 720; 174/15.1, 174/16.3; 257/706–712, 713, 722, 726, 727; 248/505, 510; 24/295, 296, 573, 625; 165/80.2, 165/80.3, 185
See application file for complete search history.

(56) References Cited

U.S. PATENT DOCUMENTS

| | | | |
|---|---|---|---|
| 5,893,409 A * | 4/1999 | Kohler et al. | 165/80.3 |
| 6,188,576 B1 | 2/2001 | Ali et al. | |
| 6,191,478 B1 | 2/2001 | Chen | |
| 6,208,517 B1 * | 3/2001 | Prince et al. | 361/704 |
| 6,233,150 B1 | 5/2001 | Lin et al. | |
| 6,275,380 B1 * | 8/2001 | Bollesen | 361/704 |
| 6,445,583 B1 * | 9/2002 | Kline et al. | 361/704 |
| 7,224,048 B1 * | 5/2007 | McLellan et al. | 257/678 |
| 7,230,831 B2 * | 6/2007 | Luckner et al. | 361/719 |

FOREIGN PATENT DOCUMENTS

| | | |
|---|---|---|
| DE | 24 25 723 A1 | 5/1974 |
| DE | 196 40 381 A1 | 6/1998 |
| EP | 0 777 270 A1 * | 4/1997 |

* cited by examiner

*Primary Examiner*—Michael Datskovskiy
(74) *Attorney, Agent, or Firm*—Edell, Shapiro & Finnan, LLC

(57) ABSTRACT

A heat sink for surface-mounted semiconductor devices is provided on a superordinate circuit board of an electronic module. The heat sink includes a three-dimensionally structured thermally conductive plate with a press-on region and snap-action hooks. The snap-action hooks are arranged approximately at right angles with respect to the press-on region and are spring-elastically connected to the press-on region of the heat sink via a spring-elastic connecting region of the heat sink. The snap-action hooks engage with edge regions of a thermally conductive coupling plate with the press-on region generating pressure. The coupling plate is fixed to a rear side of a semiconductor chip of the surface-mounted semiconductor device.

16 Claims, 5 Drawing Sheets

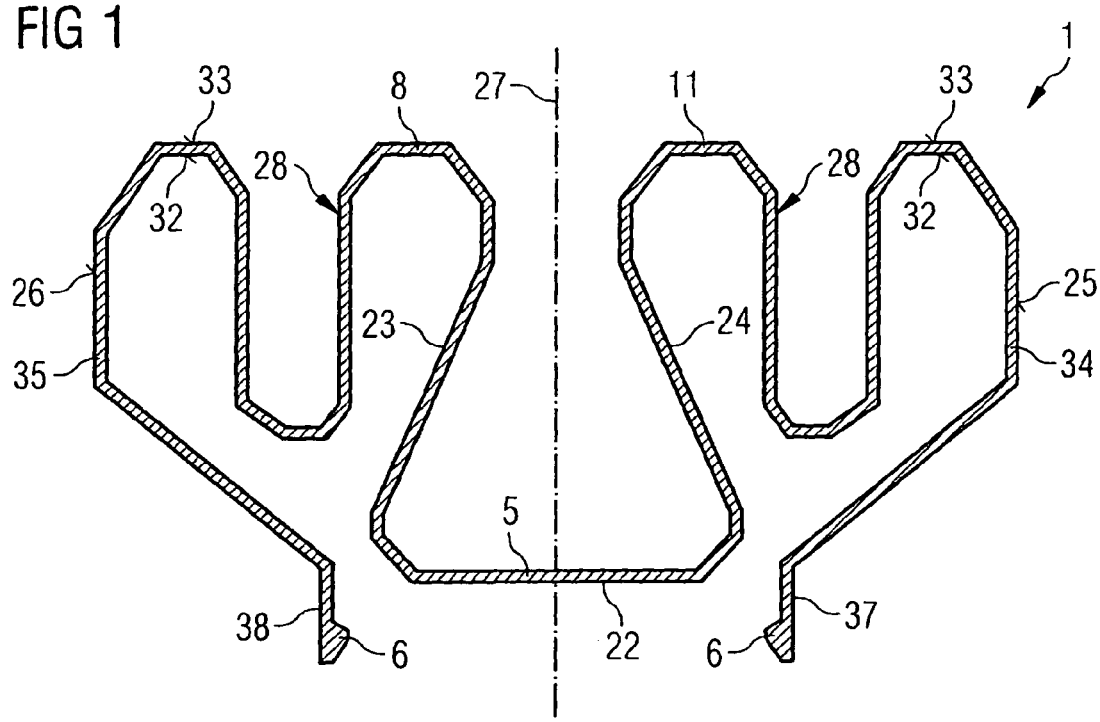
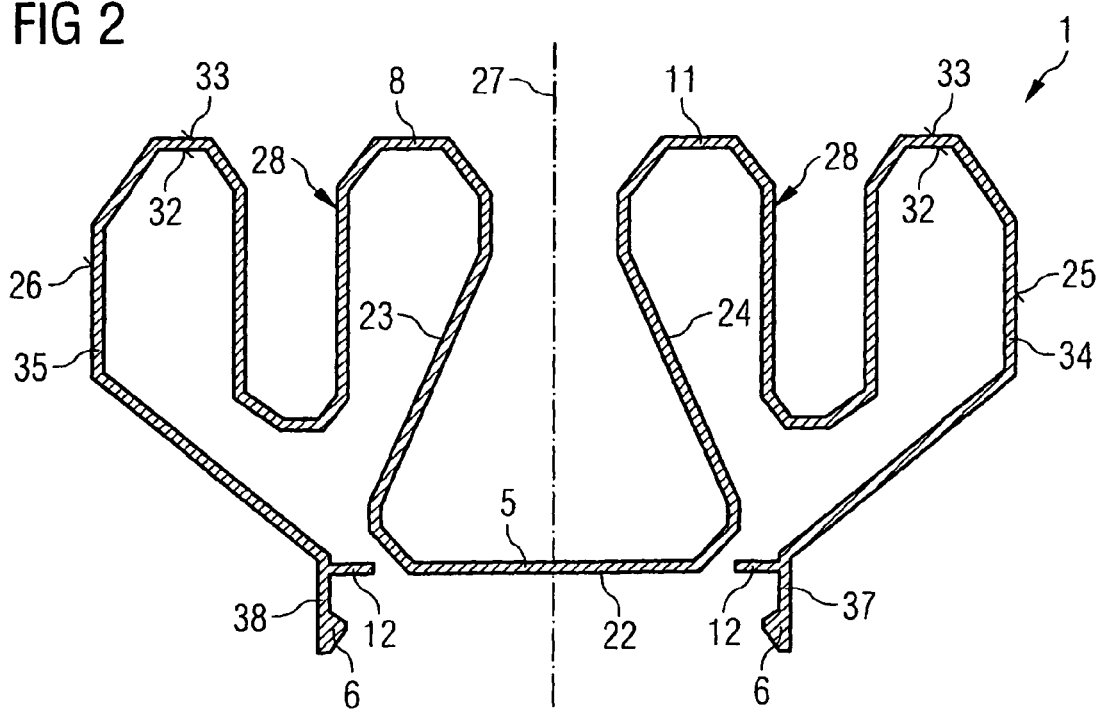

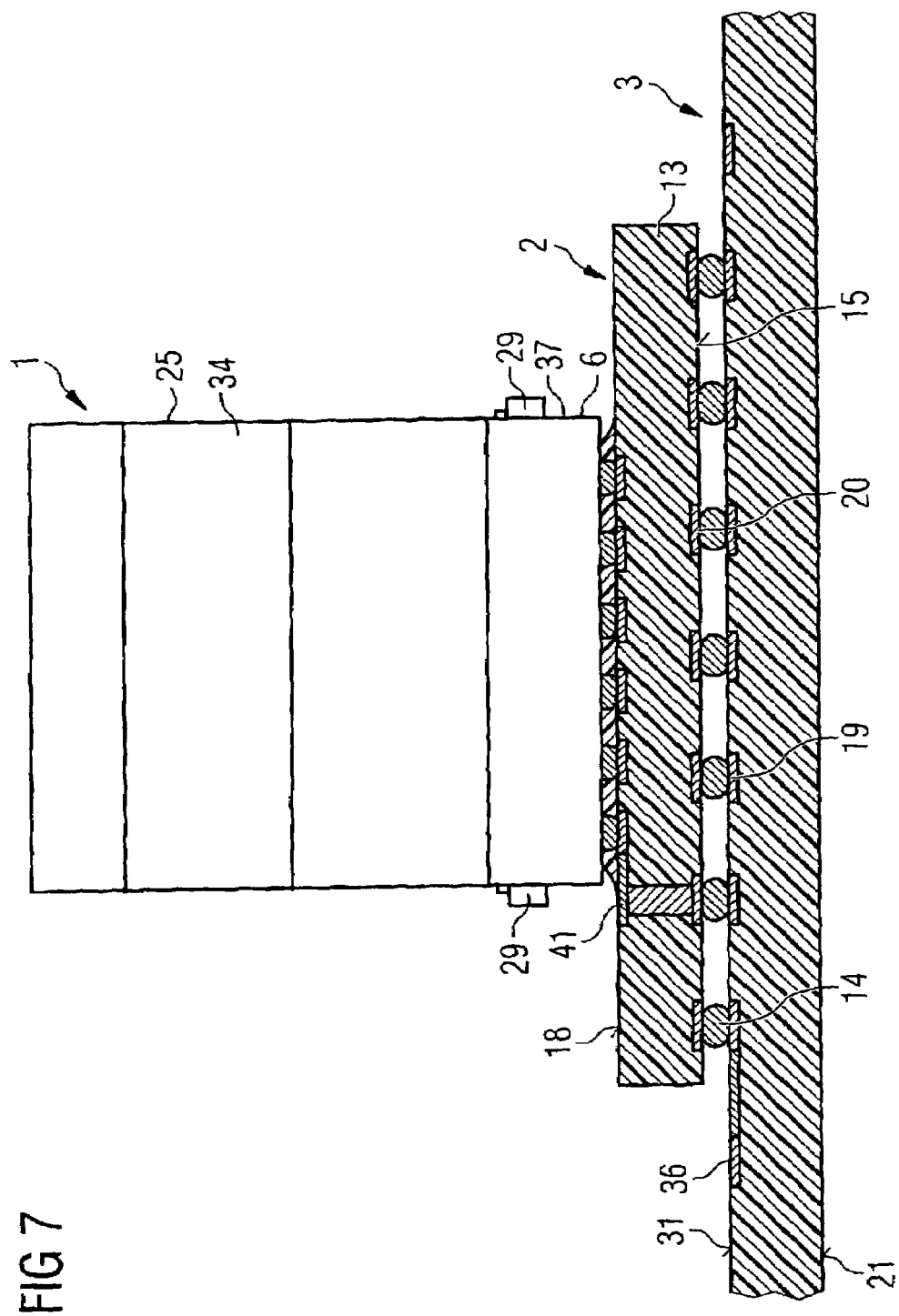

HEAT SINK FOR SURFACE-MOUNTED SEMICONDUCTOR DEVICES AND MOUNTING METHOD

CROSS REFERENCE TO RELATED APPLICATIONS

This application claims priority under 35 USC §119 to German Application No. DE 10 2005 012 216.7, filed on Mar. 15, 2005, and titled "Heat Sink for Surface-Mounted Semiconductor Devices and Mounting Method," the entire contents of which are hereby incorporated by reference.

FIELD OF THE INVENTION

The invention relates to a heat sink for surface-mounted semiconductor devices on a superordinate circuit board of an electronic module, and to a mounting method for said heat sink.

BACKGROUND

U.S. Pat. No. 6,233,150 discloses a memory module having a memory card with a circuit board and a number of electronic components mounted on the circuit board. The memory module has, as a heat sink, a pair of covers arranged on mutually opposite surfaces of the circuit board and a pair of clamps that press the two covers onto the circuit board. Each of the covers is thermally and electrically conductive and affords protection from electromagnetic radiation.

A complete heat sink of this type extends over all semiconductor devices of a memory module and thus thermally couples all of the semiconductor devices independently of their different power losses in a common housing. One disadvantage is impermissible heating of adjacent semiconductor devices. A further disadvantage is the high material outlay, which thus increases the costs, and, finally, there is the disadvantage that, in addition to producing the covers, it is also necessary to produce clamping elements in the form of clips, which increases the manufacturing costs.

U.S. Pat. No. 6,188,576 discloses a memory module having a housing cover in order to enclose a circuit board which has a plurality of individual semiconductor devices that dynamically generate different quantities of heat. The housing cover provides heat dissipation for the plurality of different memory chips. The different memory chips are thus thermally interconnected via the circuit board and via corresponding solder balls. Besides the heat dissipation, the rigid housing protects both the circuit board and the chips.

In an embodiment disclosed in U.S. Pat. No. 6,188,576, the memory module includes a thermally conductive substance arranged within the housing cover in order to conduct heat from the individual chips to the housing cover. The covers have snap-action hooks which reach over the edges of the circuit board and clamp the covers onto the circuit board from both sides. In this embodiment, there is also the risk of impermissible heating of adjacent semiconductor devices which intrinsically generate a reduced power loss and are then impermissibly additionally heated by the heat distribution of the thermally conductive substance and the thermally conductive covers. Moreover, here as well there is the disadvantage of an increased material outlay, which drives up the costs.

SUMMARY OF THE INVENTION

The present invention provides a heat sink which makes it possible to cool a product with a flip-chip semiconductor housing in accordance with a BGA type (ball grid array) with an open chip rear side, the semiconductor chip being mounted on the substrate of a memory module by its flip-chip contacts, and the memory module being a dual inline memory module or DIMM semiconductor device, by way of example. The present invention renders it possible for the semiconductor chip having flip-chip contacts to be hotter than the surrounding components in the operating state. However, only individual semiconductor devices having semiconductor chips of this type are cooled by the heat sink, without further components such as DRAMs, for example, being impermissibly heated by the heat generated by the semiconductor chips having flip-chip contacts.

In accordance with the present invention, a heat sink for surface-mounted semiconductor devices is provided on a superordinate circuit board of an electronic module. The heat sink includes a three-dimensionally structured thermally conductive plate with a press-on region and with snap-action hooks. The snap-action hooks are arranged approximately at right angles with respect to the press-on region and are spring-elastically connected to the press-on region of the heat sink via a spring-elastic connecting region of the heat sink. The snap-action hooks engage with edge regions of a thermally conductive coupling plate with the press-on region generating pressure on the coupling plate, the coupling plate being fixed to a rear side of a semiconductor chip of the surface-mounted semiconductor device.

The above and still further features and advantages of the present invention will become apparent upon consideration of the following detailed description of specific embodiments thereof, particularly when taken in conjunction with the accompanying drawings wherein like reference numerals in the various figures are utilized to designate like components.

BRIEF DESCRIPTION OF THE DRAWINGS

FIG. 1 depicts a schematic cross section through a heat sink in accordance with an embodiment of the invention.

FIG. 2 depicts a schematic cross section through a heat sink in accordance with a second embodiment of the invention.

FIG. 7 depicts a schematic side view of the heat sink with semiconductor device as depicted in FIG. 3.

DETAILED DESCRIPTION

Figure 3:
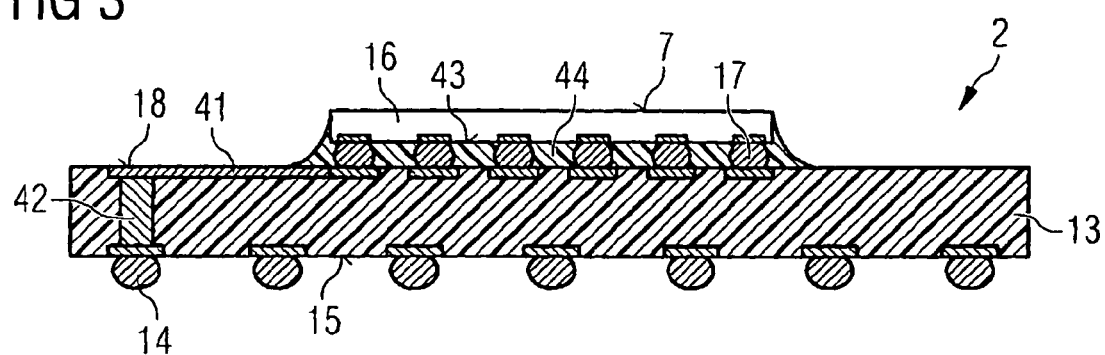
FIG. 3 depicts a schematic cross section through a semiconductor device before a coupling plate is fixed in accordance with the invention.

In accordance with the present invention, a heat sink for surface-mounted semiconductor devices is provided on a superordinate circuit board of an electronic module. The heat sink includes a three-dimensionally structured thermally conductive plate with a press-on region and with snap-action hooks. The snap-action hooks are arranged approximately at right angles with respect to the press-on region and are spring-elastically connected to the press-on region of the heat sink via a spring-elastic connecting region of the heat sink. The snap-action hooks engage with edge regions of a thermally conductive coupling plate with the press-on region generating pressure on the coupling plate, the coupling plate being fixed to a rear side of a semiconductor chip of the surface-mounted semiconductor device.

The following advantages are achieved by both the thermally and mechanically calculated and simulated design of the heat sink of the invention:

1. The tolerances of the semiconductor device and the tolerances of the circuit board are not restricted by the embodiment of the spring-elastic connecting region of the heat sink in conjunction with the coupling plate.

2. In the mounted state, the heat sink permits forced cooling air to contribute to the cooling on the entire surface of the heat sink and, in particular, also in regions of the underside of the heat sink. For cooling the underside, the spring-elastic connections to the snap-action hooks are formed in correspondingly planar fashion.

3. The heat sink is pressed and elastically deformed in a defined manner in the course of mounting in order to sink the snap-action hooks in at the edges of the coupling plate. After mounting and then releasing the spring force of the elastic connection between the press-on region and snap-action hooks, the press-on region holds securely on the coupling plate which, for its part, is fixed to the rear side of the semiconductor chip.

4. The snap-action hooks which reach over the edge of the coupling plate anchor the heat sink reliably and securely to the coupling plate and, by an adhesive layer, to the rear side of the semiconductor chip. It has been found that, during shock tests and vibration tests, fixed retention is obtained and neither the coupling plate is deformed nor the semiconductor chip damaged; the fixed coupling plate is not even torn away from the semiconductor chip.

5. Using so-called support parts such as stop brackets on the heat sink, the latter can be spring-elastically prestressed only in a specific permissible region on the edges of the coupling plate, so that the semiconductor device and the associated semiconductor chip are not stressed and/or damaged.

6. Since the heat sink constitutes a three-dimensionally structured thermally conductive plate, it is suitable for mass production and is embodied in machine-mountable fashion.

7. The heat sink is easy to remove on account of the snap-action hooks and, after removal, facilitates repair of the underlying semiconductor devices or the semiconductor devices arranged beside it on a circuit board.

8. The coupling plate is matched to the areal extent of the rear side of the semiconductor chip (which is to be cooled) in such a manner that it perfectly protects the semiconductor chip, even without a bulky heat sink, during handling for test purposes, during transport and during the mounting of the semiconductor device on superordinate circuit boards.

9. The heat sink makes it possible to repair adjacent semiconductor devices, such as DRAMs, even without removing the heat sink itself.

10. The heat sink comprising a shaped metal plate can be an oversized metal spring which combines good elastic properties and good thermal properties and can advantageously be put on only when the critical mounting operation, for example by soldering the surface-mountable semiconductor device onto a superordinate circuit board, has been finally concluded.

In one preferred embodiment of the invention, the elasticity of the spring-elastic connecting region between the press-on region and the snap-action hooks is matched to the required pressure in the press-on region. This mechanically calculated and simulated design makes it possible for the heat transfer to be optimal in the press-on region.

In another preferred embodiment of the invention, the coupling plate is closely matched to the areal extent of the rear side of the semiconductor chip in such a manner that its edges project beyond the edges of the rear side of the semiconductor chips with an overhang of $w \leq 1$ mm. This has the advantage that the semiconductor chip and the semiconductor device are neither bent nor sheared if a vertical pressure is exerted on the coupling plate when mounting the semiconductor device. In addition, the weight of the coupling plate is so low that the total weight of a superordinate circuit board is increased only to an insignificant extent by the coupling plate without a heat sink, with the result that each semiconductor device which is provided for a semiconductor memory module can be preventatively configured with a coupling plate of this type without significantly increasing the space requirement and the weight.

The heat sink preferably has an axis of symmetry in its cross section and has at least one spring-elastic loop on each side of the axis of symmetry in the spring-elastic connecting region. This is associated with the advantage that identical spring forces on both sides of the axis of symmetry act on the coupling plate in the press-on region of the heat sink after the snap-action hooks have been latched into place on edges of the coupling plate. The loop contour may be advantageously expanded to form a meandering contour comprising a plurality of loops on both sides of the axis of symmetry.

In another preferred embodiment of the invention, the heat sink has at least two snap-action hooks which are arranged opposite the press-on region. Planar compensation can be achieved despite the two snap-action hooks in the press-on region of the coupling plate since the two-point fixing is stabilized with the aid of the areal extent of the press-on region of the three-dimensionally structured thermally conductive plate from which the heat sink is formed.

In another embodiment of the invention, the press-on region is quadrilateral and is matched to the shape of the rear side of the semiconductor chip of a surface-mounted semiconductor device, so that it preferably has four snap-action hooks, i.e. in each case one at each corner. In this embodiment of the invention, the press-on effect of the snap-action hooks is equalized.

In order to achieve a dimensionally stable and rigid press-on region, the three-dimensionally structured plate has a bend between the spring-elastic region of the heat sink and the press-on region. In this case, the bend forms the edges of the press-on region and thus provides for the dimensionally stable contour of the press-on region with respect to the spring-elastic structure of the heat sink, which extends from the press-on region as far as the snap-action hooks angled away virtually at right angles from the press-on region.

In one preferred embodiment of the invention, the heat sink itself may comprise readily thermally conductive metal, such as, for example, a copper alloy in the form of CuCrSiTi with 0.3% by weight of Cr, 0.1% by weight of Ti, 0.02% by weight of Si, remainder copper and with a thermal conductivity of 310 W/mK.

The metal used for the three-dimensionally structured thermally conductive plate used as a heat sink has correspondingly mechanical properties in order, on the one hand, to ensure the spring properties in the spring-elastic region, and, on the other hand, to have a corresponding dimensional stability in the press-on region. The mechanical properties preferably have a tensile strength of >530 MPa and a 0.2% proof stress of >460 MPa. The thermal contact area of the heat sink is formed by the abovementioned press-on region which bears, after the heat sink has been mounted, on the coupling plate and thus intensively cools the rear side of the semiconductor chip.

In another embodiment of the invention, the heat sink is constructed in one piece with the press-on region and snap-action hooks. This has the advantage that the complete heat sink with the press-on region, spring-elastic connecting region and snap-action hooks can be shaped in one piece from a corresponding metal plate by means of a single stamping and shaping process.

In another embodiment of the invention, the snap-action hooks have limbs which have stop brackets and delimit the engagement region of the snap-action hooks. The stop brackets are arranged approximately at right angles on the limbs and are supported on the top side of the coupling plate if the snap-action hooks are mounted on the edge sides of the coupling plate. In this case, the stop brackets limit the forces which act on the coupling plate and thus on the semiconductor device during mounting.

Between the coupling plate and the rear side of the semiconductor chip, the heat sink may have a thermally conductive adhesive layer which is used to fix the coupling plate to the rear side of the semiconductor chip. An intermediate layer comprising a ductile thermally conductive material may also be arranged between the press-on region of the heat sink and the coupling plate in order to improve heat transfer from the coupling plate to the heat sink. The coupling plate itself preferably has a thermally conductive copper alloy.

The invention relates not just solely to the heat sink but also to semiconductor devices which are provided with a heat sink of this type. Furthermore, the invention also relates to semiconductor modules, in particular memory modules in DIMM technology (dual inline memory module technology), which may have individual or else a plurality of heat sinks of this type.

In another specific embodiment of the invention, the semiconductor device has a circuit substrate with surface-mountable contacts on its underside and a semiconductor chip with flip-chip contacts on its top side. In this case, the coupling plate is arranged on the rear side of the semiconductor chip with flip-chip contacts. In this embodiment of the invention, by the press-on region of the heat sink, a pressure is exerted on the coupling plate but no pressure is exerted on the rear side of the semiconductor chip. When mounting the heat sink, the pressure load on the rear side of the semiconductor chip is distributed in a virtually uniform manner by the coupling plate. The magnitude of the pressure or of the force on the rear side depends on the spring elasticity of the connecting region of the heat sink and may be dimensioned in such a way as to obtain optimum thermal coupling of the heat sink and semiconductor device via the coupling plate after the heat sink has been fitted.

A mounting method for fitting a heat sink on a surface-mountable semiconductor device has the following method steps. Firstly, a thermally conductive coupling plate is mounted on a rear side of a semiconductor chip of the surface-mountable semiconductor device in such a manner that the edges of the coupling plate project beyond the edges of the rear side of the semiconductor chip. A heat sink is then taken up from a heat sink supply tray, the heat sink having snap-action hooks which are connected to a press-on region of the heat sink via a spring-elastic connecting region. The snap-action hooks are aligned with the edges of the coupling plate. The snap-action hooks are then engaged with the edges of the coupling plate with elastic deformation of the spring-elastic connecting region and with the press-on region pressing on the coupling plate.

This method has the advantage that, in order to fit the heat sink, only the coupling plate on the rear side comes into contact with the snap-action hooks and the press-on region of the heat sink, and the heat sink thus does not have to be fixed to a surface-mountable semiconductor device when transporting and mounting the semiconductor device, with the result that mounting and transport are facilitated. The heat sink may also be fixed individually to individual semiconductor devices without the layout and design of the circuit board and circuit substrate of a semiconductor module having to be changed or matched to the heat sink.

The heat sink may be put on or fixed at a later date if tests should reveal that one of the surface-mountable semiconductor devices of a semiconductor module generates an impermissibly high heat loss. To this end, the semiconductor device without a heat sink may first of all be mounted on a circuit board by a coupling plate that is fixed to the rear side of the semiconductor chip of the semiconductor device, and the snap-action hooks of the heat sink can then be engaged with the edges of the coupling plate.

In one preferred implementation of the mounting method, in order to fix the thermal coupling plate to the rear side of a semiconductor chip, the coupling plate is adhesively bonded using a thermally conductive adhesive. The thermal conductivity of the adhesive may be improved by means of a readily thermally conductive filler.

This method also has the advantage that, with few automatic handling processes, the heat sink can be arranged and anchored at corresponding positions in a semiconductor memory module and, at the same time, intensive thermal coupling between the heat sink and semiconductor device can be produced. Provision is preferably made for surface-mountable contacts of the semiconductor device to be soldered to contact pads of the circuit board of the semiconductor module so that extreme loads can be transmitted. It is also possible to adhesively bond the surface-mountable contacts to the contact pads of the circuit board using a conductive adhesive.

The effectiveness of the novel heat sink for memory modules was verified with the aid of simulation methods and wind tunnel experiments.

The invention is now explained in further detail with reference to the accompanying figures.

FIG. 1 shows a schematic cross section through a heat sink 1 of a first embodiment of the invention. The heat sink 1 is shown in profile here and has a press-on region 5 at its center and two spring-elastic connecting regions 8 and 11 on each side of an axis of symmetry 27 that divides the press-on region 5 in half. In this embodiment of the invention, the press-on region 5 has a well contour with a plane bottom 22 and raised-up edges 23 and 24. These edges 23 and 24 merge with the connecting regions 8 and 11 which have a meandering contour 28 and merge with snap-action hook limbs 34 and 35 which are bent in the form of a loop and have snap-action hooks 6 at the ends of the limbs 37 and 38. These snap-action hooks 6 may be engaged with edges of a coupling plate (not shown), so that the bottom 22 of the press-on region 5 is pressed onto the top side of the thermal coupling plate.

FIG. 2 shows a schematic cross section through a heat sink 1. Components having the same functions as in FIG. 1 are indicated using the same reference symbols and are not additionally discussed. In this embodiment, stop brackets 12 which delimit the engagement region of the snap-action hooks 6 when mounting the heat sink 1 are arranged on the snap-action hook limbs 34 and 35.

FIG. 3 shows a schematic cross section through a surface-mountable semiconductor device 2 before a coupling-plate is fixed to the semiconductor device 2. The semiconductor device 2 has a BGA construction. The latter comprises, in this embodiment of the invention, a circuit substrate 13 including a wiring structure 41 on the top side 18 and surface-mountable contacts 14 on the underside 15. The surface-mountable contacts 14 on the underside 15 are electrically connected to the wiring structure 41 on the top side 18 of the circuit substrate 13 via through-contacts 42. A semiconductor chip 16 which is electrically connected to the wiring structure 41 on the top side 18 of the circuit substrate 13 via flip-chip contacts 17 is arranged on the top side 18 of the circuit substrate 13, the interspace between the active top side 43 of the semiconductor chip 16 and the top side 18 of the circuit substrate 13 being filled with a plastic composition 44.

Figure 4:
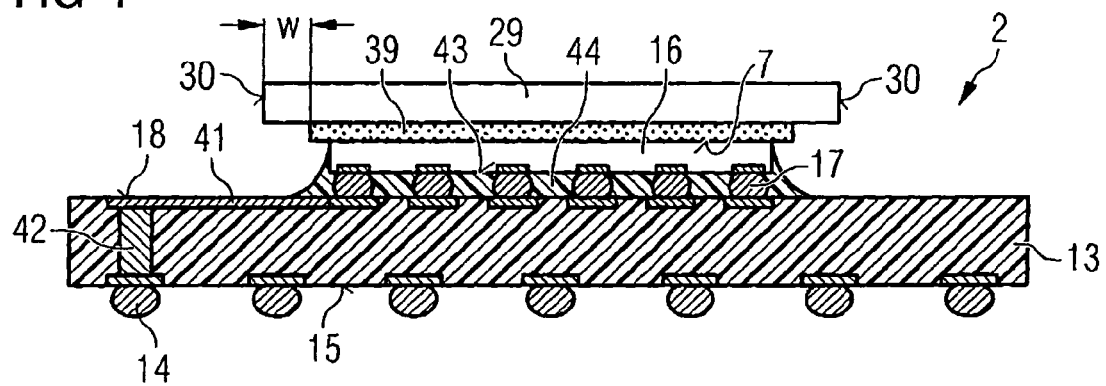
FIG. 4 depicts a schematic cross section through the semiconductor device shown in FIG. 3 with the coupling plate which has been fixed in place.

FIG. 4 shows a schematic cross section through the semiconductor device 2 shown in FIG. 3 with a coupling plate 29 which has been fixed in place. This thermally conductive coupling plate 29 comprising a readily conductive metal alloy is fixed to the rear side 7 of the semiconductor chip 16 by an adhesive layer 39. The areal extent of the coupling plate 29 is matched to the semiconductor chip 16 and projects beyond the edges of the semiconductor chip 16 by a width of $w \leqq 1$ mm, so that the snap-action hooks of the heat sink can latch into place on the edges.

Figure 5:
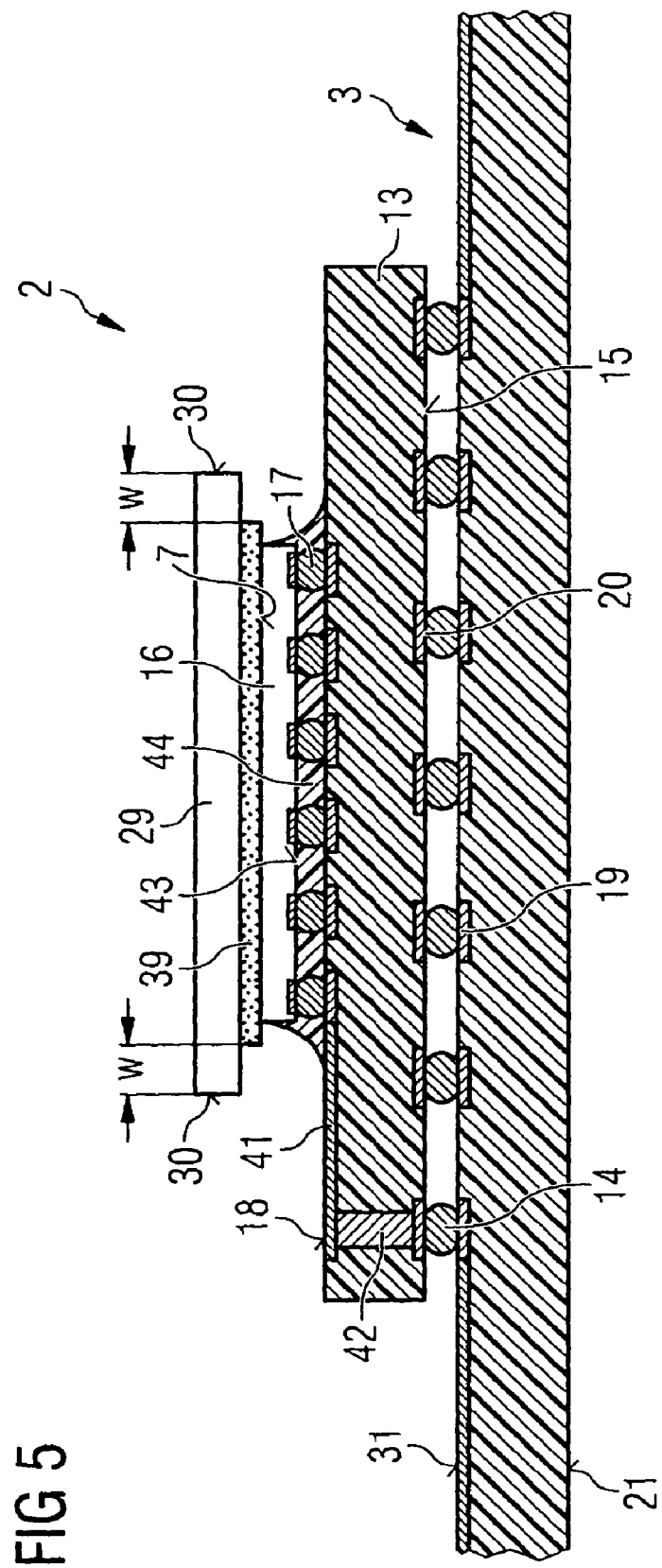
FIG. 5 depicts a schematic cross section through the semiconductor device shown in FIG. 4 after the semiconductor device has been applied to a superordinate circuit board.

FIG. 5 shows a schematic cross section through the semiconductor device 2 shown in FIG. 4 after the semiconductor device 2 has been applied to a superordinate circuit board 3 which is, for example, a memory card and belongs to a semiconductor memory module. FIG. 5 advantageously shows that the semiconductor device 2 with the coupling plate 29 can be used like a standardized surface-mountable semiconductor device 2 without having to match the design or the arrangements on a superordinate circuit board 3 to the semiconductor device 2 that has been provided with a coupling plate 29 or without having to change the circuit board 3 in a particular manner for the purpose of accommodating a heat sink according to the invention.

Figure 6:
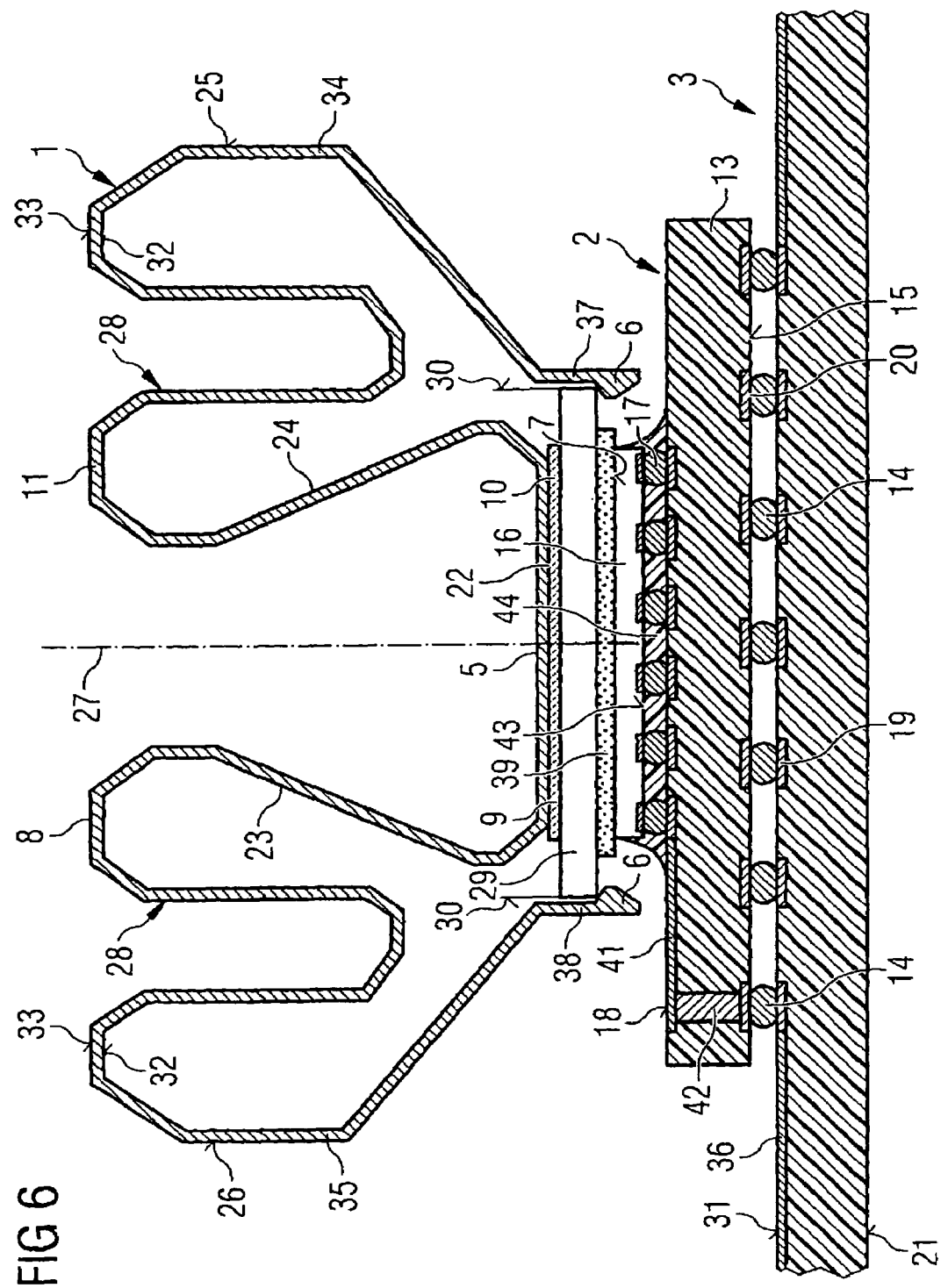
FIG. 6 depicts a schematic cross section through a heat sink which is fixed to a semiconductor device in accordance with the invention.

FIG. 6 shows a schematic cross section through a heat sink 1 which is fixed to a semiconductor device 2 in accordance with the invention. In this embodiment of the invention, the metal alloy of the heat sink 1 comprises a readily conductive copper alloy CuCrSiTi (comprising 0.3% by weight of Cr, 0.1% by weight of Ti, 0.02% by weight of Si and the remainder copper). This copper alloy has a thermal conductivity of 310 W/mK and has a tensile strength that is greater than 530 MPa. The 0.2% proof stress is over 460 MPa. These mechanical properties (i.e., the tensile strength and the proof stress) also make it possible to form the connecting regions 8 and 11 with their spring-elastic properties from a sheet-metal plate of this metal, a plate thickness of between 0.3 mm and 0.5 mm being used.

The heat sink 1 is thus a three-dimensionally structured thermally conductive plate 4 which, in addition to the press-on region 5, has connecting regions 8 and 11 on both sides of the press-on region 5, the connecting regions 8 and 11 being spring-elastic and merging with snap-action hooks 6 almost vertically with respect to the connecting regions 8 and 11 and the press-on region 5. These snap-action hooks 6 are arranged at the ends of a meandering contour 28 of the spring-elastic connecting regions 8 and 11 of the plate 4 of the heat sink 1 and engage with the edges 30 of the coupling plate 29.

The cross section of the mounted heat sink 1 shows that, in the case of a moving cooling medium such as air, the cooling medium actively flushes around both the underside 32 and the top side 33 of the heat sink 1. An intermediate layer 10 comprising a ductile thermally conductive material 9 between the coupling plate 29 and the heat sink 1 reduces the thermal contact resistance between the rear side 7 of the semiconductor chip 16 and the surrounding air of the heat sink 1.

The circuit board 3 has a printed circuit for a semiconductor module. The other devices of the semiconductor module are not shown here and may optionally include a heat sink of this type. If, however, the power loss of the other components is not very high, for example in the case of so-called DRAMs, a heat sink 1 of this type may be omitted.

FIG. 7 shows a schematic side view of the heat sink 1 shown in FIG. 6. In this side view, the cooling area of the side 25 of the heat sink 1, which is formed solely by a limb 34 of a snap-action hook 6, is significantly larger than the heat-dissipating top sides of the active semiconductor chip to be cooled. In this embodiment, the surface-mountable contacts 14 of the circuit substrate 13 are soldering contacts 20 and are soldered to corresponding contact pads 19 on the top side 31 of the circuit board 3. The contact pads 19 are part of a wiring structure 36 of the circuit board 3. The underside 21 of the circuit board 3 may be fitted with further semiconductor devices.

While the invention has been described in detail and with reference to specific embodiments thereof, it will be apparent to one skilled in the art that various changes and modifications can be made therein without departing from the spirit and scope thereof. Accordingly, it is intended that the presents intention covers the modifications and variations of this invention provided they come within the scope of the appended claims and their equivalents.

What is claimed:

1. A heat sink for surface-mounted semiconductor devices disposed on a superordinate circuit board of an electronic module, the heat sink comprising:
   a three-dimensionally structured thermally conductive plate including a press-on region and snap-action hooks, the snap-action hooks being arranged approximately at right angles with respect to the press-on region and being spring-elastically connected to the press-on region via a spring-elastic connecting region of the heat sink;
   wherein the snap-action hooks are configured to engage with edge regions of a thermally conductive coupling plate that is fixed to a rear side of a semiconductor chip on a surface-mounted semiconductor device such that the press-on regions generate pressure on the coupling plate, and the snap-action hooks comprise limbs with stop brackets that are configured to limit engagement regions of the snap-action hooks.

2. The heat sink of claim 1, wherein the elasticity of the spring-elastic connecting region between the press-on region and the snap-action hooks forces the press-on region against the thermally conductive coupling plate.

3. The heat sink of claim 1, wherein the coupling plate is suitably dimensioned such that the edges of the coupling plate project beyond the edges of the rear side of the semiconductor chip with an overhang dimension of no greater than 1 mm.

4. The heat sink of claim 1, wherein the heat sink comprises a thermally conductive copper alloy.

5. The heat sink of claim 1, wherein the heat sink comprises CuCrSiTi, including 0.3% by weight of chromium, 0.1% by weight of titanium, 0.02% by weight of silicon and the remainder copper.

6. The heat sink of claim 1, wherein the heat sink comprises at least two snap-action hooks that are arranged at opposing locations with respect to the press-on region.

7. The heat sink of claim 1, wherein the press-on region has a geometrical configuration that matches the rear side of the semiconductor chip of the surface-mountable semiconductor device and includes four snap-action hooks.

8. The heat sink of claim 1, wherein the heat sink has an axis of symmetry in along a cross section of the heat sink and includes at least one spring-elastic loop on each side of the axis of symmetry in the spring-elastic connecting region.

9. The heat sink of claim 1, wherein the press-on region and snap-action hooks are formed as a single piece.

10. The heat sink of claim 1, further comprising:
a thermally conductive adhesive layer arranged between the coupling plate and the rear side of the semiconductor chip.

11. The heat sink of claim 1, further comprising:
an intermediate layer comprising a ductile thermally conductive material, the intermediate layer being arranged between the press-on region and the coupling plate.

12. A semiconductor device mounted on a circuit board and comprising the heat sink of claim 1.

13. The semiconductor device of claim 12, wherein the semiconductor device further comprises a circuit substrate with surface-mountable contacts disposed on an underside of the circuit substrate and a semiconductor chip with flip-chip contacts disposed on a top side of the circuit substrate, wherein the surface-mountable contacts of the circuit substrate comprise soldering connections to contact pads of the superordinate circuit board.

14. A semiconductor module on a circuit board, the semiconductor module comprising the semiconductor device of claim 12.

15. A mounting method for fitting a heat sink on a surface-mountable semiconductor device, the method comprising:
securing a thermal coupling plate to a rear side of a semiconductor chip of a surface-mountable semiconductor device, such that the edges of the coupling plate project beyond the edges of the rear side of the semiconductor chip; and
securing a heat sink to the coupling plate, the heat sink including snap-action hooks that are connected to a press-on region of the heat sink via a spring-elastic connecting region, wherein the snap-action hooks are aligned with the edges of the coupling plate and are latched into place against the coupling plate by deformation of the spring-elastic connecting region so as to press the press-on region against the coupling plate, and the snap-action hooks comprise limbs with stop brackets that are configured to limit engagement regions of the snap-action hooks.

16. The mounting method of claim 15, wherein the thermal coupling plate is secured to the rear side of a semiconductor chip using a thermally conductive adhesive.

* * * * *